United States Patent
Shin et al.

(10) Patent No.: US 7,301,533 B2
(45) Date of Patent: Nov. 27, 2007

(54) BUFFER CIRCUIT AND ACTIVE MATRIX DISPLAY USING THE SAME

(75) Inventors: Dong-Yong Shin, Seoul (KR); Bo-Yong Chung, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 703 days.

(21) Appl. No.: 10/776,998

(22) Filed: Feb. 10, 2004

(65) Prior Publication Data
US 2004/0164978 A1 Aug. 26, 2004

(30) Foreign Application Priority Data
Feb. 24, 2003 (KR) ............ 10-2003-11418

(51) Int. Cl.
*G09G 5/00* (2006.01)
(52) U.S. Cl. .................. 345/204; 345/211
(58) Field of Classification Search ............ 345/204, 345/560, 211, 212, 530, 539; 327/589
See application file for complete search history.

(56) References Cited

U.S. PATENT DOCUMENTS

| | | | | |
|---|---|---|---|---|
| 5,155,392 | A * | 10/1992 | Nogle ................ | 326/84 |
| 5,293,081 | A * | 3/1994 | Chiao et al. ............ | 327/108 |
| 5,694,061 | A | 12/1997 | Morosawa et al. | |
| 5,859,800 | A * | 1/1999 | Ueda et al. .......... | 365/189.05 |
| 6,072,354 | A * | 6/2000 | Tachibana et al. ......... | 327/390 |
| 2005/0041002 | A1* | 2/2005 | Takahara et al. ............ | 345/76 |
| 2006/0187166 | A1* | 8/2006 | Azami ................... | 345/95 |

FOREIGN PATENT DOCUMENTS

| | | |
|---|---|---|
| JP | 52-48458 | 4/1977 |
| JP | 63-211194 | 9/1988 |
| JP | 03-041820 | 2/1991 |

(Continued)

OTHER PUBLICATIONS

Patent Abstracts of Japan for Publication No. 63-211194; Date of publication of application Sep. 2, 1988, in the name of Uehara Hideaki.

(Continued)

*Primary Examiner*—Ricardo Osorio
(74) *Attorney, Agent, or Firm*—Christie, Parker & Hale, LLP

(57) ABSTRACT

A buffer circuit includes first to sixth transistors. The first transistor is coupled between a first power source and a first node, and has a gate for receiving a first signal having a first signal level. The second transistor is coupled between the first node and a second power source, and has a gate for receiving a second signal having a second signal level, which is an inverse of the first signal level. The third transistor has a gate coupled to the first node, and is coupled between the first power source and a second node. The fourth transistor is coupled between the second node and the second power source, and has a gate for receiving the first signal. The fifth transistor has a gate coupled to the second node, and is coupled between the first power source and an output end. The sixth transistor has a gate coupled to the first node, and is coupled between the output end and the second power source. In addition, a capacitance is formed between the gate of the sixth transistor and the output end.

17 Claims, 7 Drawing Sheets

FOREIGN PATENT DOCUMENTS

| | | |
|---|---|---|
| JP | 09-046216 | 2/1997 |
| JP | 09-246936 | 9/1997 |
| JP | 2002-335153 | 11/2002 |
| WO | WO 97/24797 | 7/1997 |

OTHER PUBLICATIONS

Patent Abstracts of Japan for Publication No. 03-041820; Date of publication of application Feb. 22, 1991, in the name of Hashimoto Kiyokazu.

Patent Abstracts of Japan for Publication No. 09-046216; Date of publication of application Feb. 14, 1997, in the name of Morosawa Katsuhiko.

Patent Abstracts of Japan for Publication No. 09-246936; Date of publication of application Sep. 19, 1997, in the name of Morosawa Katsuhiko et al.

Patent Abstracts of Japan for Publication No. 2002-335153; Date of publication of application Nov. 22, 2002, in the name of Asami Munehiro et al.

* cited by examiner

BUFFER CIRCUIT AND ACTIVE MATRIX DISPLAY USING THE SAME

CROSS REFERENCE TO RELATED APPLICATION

This application claims priority to and the benefit of Korean Patent Application No. 2003-11418 filed on Feb. 24, 2003 in the Korean Intellectual Property Office, the content of which is incorporated herein by reference.

BACKGROUND OF THE INVENTION (a) Field of the Invention

The present invention relates to a buffer circuit and an active matrix display using the same.

(b) Description of the Related Art

Active matrix displays, image sensors, and semiconductor memories use a shift register circuit and a buffer circuit to supply scan signals. When the shift register circuit has a large load or capacitance, a buffer circuit is installed between the shift register circuit and the load. The usage of the buffer circuit increases the magnitude of the current for charging and discharging the load, thereby increasing operation rates. If the buffer circuit becomes larger according to the load size, the capacitance at an input end of the buffer circuit increases, thereby reducing the operation rates.

Accordingly, the buffer circuit usually has a plurality of inverters coupled in series as shown in FIG. 1, and the inverters coupled in series gradually increase the magnitude of the current, thereby increasing the operation rates. The number of the inverters is generally within four.

Referring now to FIG. 2, a conventional buffer circuit will be described in detail.

As shown, the conventional buffer circuit includes two inverters respectively including two PMOS transistors M1 and M2, and two PMOS transistors M3 and M4. Sources of the transistors M1 and M3 are coupled to a high power source that supplies a high-level voltage VDD, and drains of the transistors M2 and M4 are coupled to a low power source that supplies a low-level voltage VSS. A drain of the transistor M1 and a source of the transistor M2 are coupled together, and their coupling node is coupled to the gate of the transistor M3. A drain and a gate of the transistor M2 are coupled together; and a drain and a gate of the transistor M4 are coupled together. In other words, each of the transistors M2 and M4 is diode-connected. Also, the drain of the transistor M3 and the source of the transistor M4 are coupled together, and their coupling node is defined to be an output Vout of the buffer circuit.

In this instance, when a signal Vin input applied to a gate of the transistor M1 is high-level, a gate of the transistor M3 becomes low-level because of the transistor M2. Hence, the transistor M3 is turned on. Therefore, the output Vout of the buffer circuit is determined by an on-resistance ratio of the transistors M3 and M4 to be lower than VDD. Since the transistors M3 and M4 are concurrently turned on, a static current flows through the transistors M3 and M4, thereby increasing power consumption.

When the signal Vin input to the gate of the transistor M1 is low-level, a high-level voltage, based on the on-resistance ratio of the transistors M1 and M2, of less than VDD is input to the gate of the transistor M3. Hence, the transistor M3 is turned off, thereby reducing the output voltage Vout, and a source-gate voltage at the transistor M4 accordingly reduces. Therefore, the load driving current is decreased. In this instance, when the output voltage Vout reaches VSS+ $|V_{TH4}|$ ($V_{TH4}$ is the threshold voltage of the transistor M4), current rarely flows to turn off the transistor M4, and the output voltage Vout is fixed to be VSS+$|V_{TH4}|$. Since the transistors M1 and M2 are concurrently turned on, a static current flows through the transistors M1 and M2.

In order for the buffer circuit to have sufficient driving performance even if the source-gate voltage reduces, a channel width of the transistor M4 should be increased. When the channel width increases, the on-resistance of the transistor M4 reduces, thereby decreasing the high-level output of the buffer circuit, and therefore, the channel depth of the transistor M3 should be further increased.

As described, the buffer circuit shown in FIG. 2 has a high-level output of less than VDD, and a low-level output of greater than VSS. Also, when an input is high-level, a static current flows through the inverter in the second stage, and when the input is low-level, a static current flows through the inverter in the first stage. As a result, the power consumption increases due to the static current flowing through inverters which is great for the second stage according to characteristics of the buffer circuit.

SUMMARY OF THE INVENTION

In exemplary embodiments of the present invention is provided a buffer circuit without static current flowing through the buffer itself. Therefore, power consumption is reduced and desired voltage levels are outputted.

To achieve such reduced power consumption and desired voltage levels, bootstrapping is employed.

In one exemplary embodiment of the present invention, a buffer circuit includes: a first transistor coupled between a first power source for supplying a first voltage of a first level and a first node. The first transistor has a gate for receiving a first signal having a first signal level. A second transistor is coupled between the first node and a second power source for supplying a second voltage of a second level. The second transistor has a gate for receiving a second signal having a second signal level, which is an inverse of the first signal level. A third transistor has a gate coupled to the first node, and is coupled between the first power source and a second node. A fourth transistor is coupled between the second node and the second power source, and has a gate for receiving the first signal. A fifth transistor has a gate coupled to the second node, and is coupled between the first power source and an output end. A sixth transistor has a gate coupled to the first node, and is coupled between the output end and the second power source. A capacitance is formed between the gate of the sixth transistor and the output end.

In another exemplary embodiment, the buffer circuit further includes an inverter for receiving the second signal and outputting the first signal. A third node for outputting the first signal is coupled to the gate of the first transistor.

In yet another exemplary embodiment, the inverter may include: a seventh transistor coupled to the first power source and the third node, the seventh transistor having a gate for receiving the second signal; and an eighth transistor being diode-connected, and being coupled between the third node and the second power source. The inverter may alternatively include: a seventh transistor coupled to the first power and the third node, the seventh transistor having a gate for receiving the second signal; an eighth transistor coupled to the third node and the second power, wherein another capacitance is formed between a gate of the eighth transistor and the third node; and a ninth transistor being diode-connected, and being coupled between the gate of the eighth transistor and the second power source.

In yet another exemplary embodiment, the buffer circuit may further include a transistor having a gate coupled to the output end, the transistor being coupled between the gate of the fifth transistor and the second node. The buffer circuit may alternatively further include a transistor having a gate coupled to the output end, the transistor being coupled between the third and fourth transistors. The buffer circuit alternatively may further include: a transistor coupled between the first power source and the gate of the third transistor, the transistor having a gate for receiving the first signal; and a transistor coupled between the gate of the third transistor and the second power source, the transistor having a gate for receiving the second signal.

In still another exemplary embodiment, the buffer circuit further includes: a transistor having a gate for receiving the second signal, the transistor being coupled between the first power source and the gate of the first transistor; and a transistor having a gate for receiving the first signal, the transistor being coupled between the gate of the first transistor and the second power source.

In a further exemplary embodiment, at least a part of the capacitance is formed by parasitic capacitance of the sixth transistor.

In a yet further exemplary embodiment, at least a part of the capacitance is formed by a capacitor coupled between the gate of the sixth transistor and the output end.

In a still further exemplary embodiment, the first through sixth transistors are PMOS transistors, the first level is a high level, and the second level is a low level.

In yet another exemplary embodiment, the first through sixth transistors are NMOS transistors, the first level is a low level, and the second level is a high level.

In another exemplary embodiment of the present invention, a buffer circuit includes: a first transistor coupled between a first power source for supplying a first voltage of a first level and an output end. A second transistor is coupled between a second power source for supplying a second voltage of a second level and the output end, wherein capacitance is formed between the gate of the second transistor and the output end. A driving circuit for the first and second transistors includes a third transistor coupled between the gate of the second transistor and the second power source. The third transistor has a gate for receiving a first signal having a first signal level. The driving circuit turns on the first transistor and turns off the second transistor when the first signal level is substantially the first level, and the driving circuit turns on the third transistor to charge the capacitance with voltage, floats the gate node of the second transistor so that the second transistor can bootstrap, and turns off the first transistor, when the first signal level is substantially the second level.

In yet another exemplary embodiment, the driving circuit further includes: a fourth transistor coupled between the first power source and the gate of the first transistor. The fourth transistor is turned on when the first signal level is substantially the second level. A fifth transistor is coupled between the gate of the first transistor and the second power source. The fifth transistor is turned on when the first signal level is substantially the first level.

In still another exemplary embodiment of the present invention, an active matrix display includes: a plurality of buffer circuits, each having one or more of the features described above. The active matrix display includes a driving signal supply for supplying a plurality of first driving signals to the plurality of buffer circuits, respectively. A display panel includes: a plurality of first signal lines for transmitting the first driving signals that are passed and output, respectively, through the buffer circuits. A plurality of second signal lines are provided for respectively transmitting a plurality of second driving signals. The second signal lines are formed crossing the first signal lines. Pixel circuits are coupled to the first and second signal lines, wherein the pixel circuits are operable by the first and second driving signals.

In still yet another exemplary embodiment of the present invention, a bootstrap circuit includes: a first transistor coupled between a first power source for supplying a first voltage of a first level and an output end. A second transistor is coupled between the output end and a second power source for supplying a second voltage of a second level. A capacitance is formed between a gate of the second transistor and the output end. A driving circuit is for receiving first and second signals having first and second signal levels, respectively, that are inverse of one another. The driving circuit respectively turns on the first transistor and turns off the second transistor when the first signal level is substantially the first level. In this instance, the driver circuit applies a third voltage which has substantially the same voltage level as the second level to the gate of the second transistor to charge the capacitance with voltage, floats the gate node of the second transistor, and turns off the first transistor to bootstrap the second transistor, when the first signal level is changed to substantially the second level from substantially the first level.

BRIEF DESCRIPTION OF THE DRAWINGS

The accompanying drawings, which together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various different ways, all without departing from the spirit or scope of the present invention. Accordingly, the drawings and description are to be regarded as illustrative in nature, and not restrictive.

Exemplary embodiments of a buffer circuit and a flat panel display using the same will be described in detail in reference to the drawings.

Figure 1:
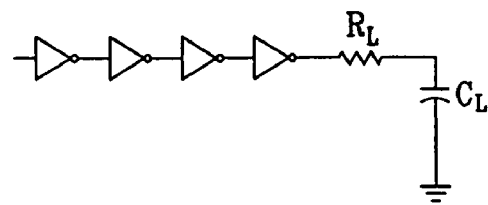
FIG. 1 shows a brief circuit diagram of a conventional buffer circuit.
Figure 2:
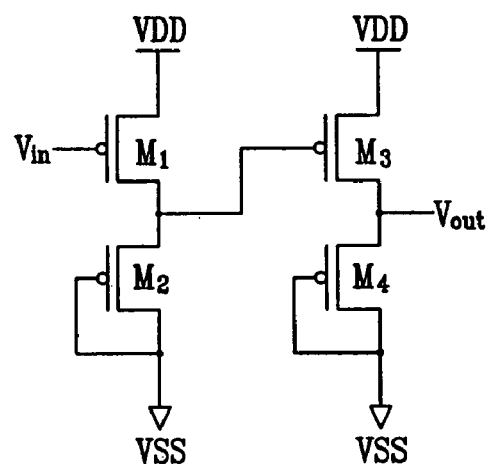
FIG. 2 shows a circuit diagram of the conventional buffer circuit.
Figure 3:
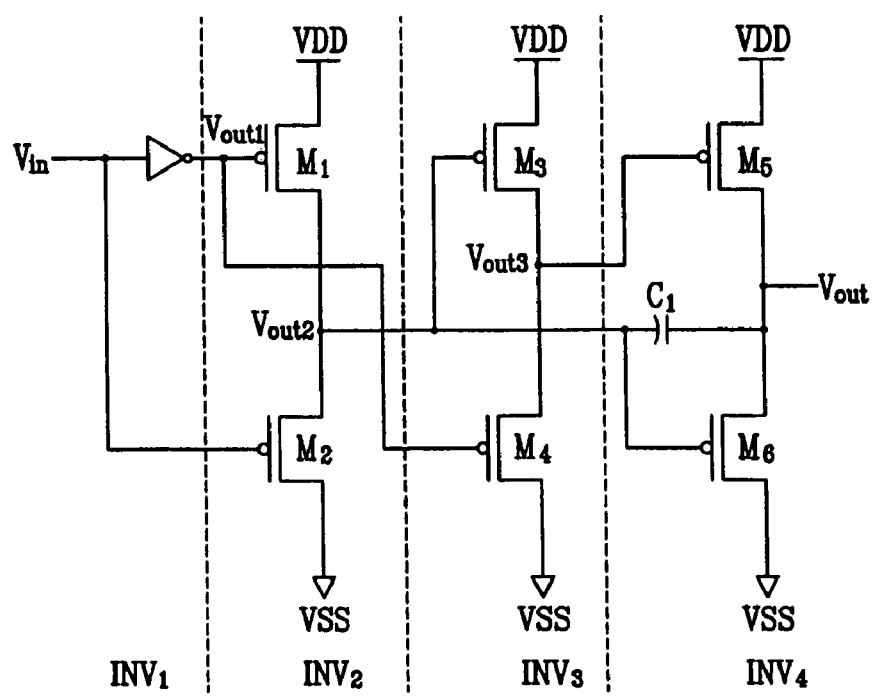
FIG. 3 shows a circuit diagram of a buffer circuit according to an exemplary embodiment of the present invention.
Figure 4A:
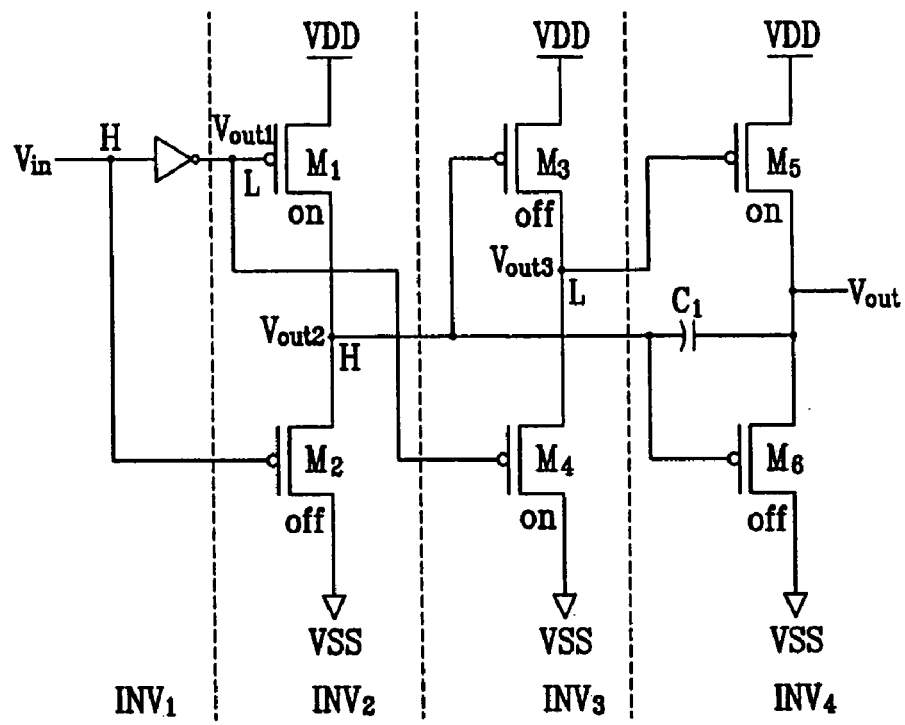
FIGS. 4A through 4D show an operation of the buffer circuit according to one exemplary embodiment of the present invention.
Figure 4B:
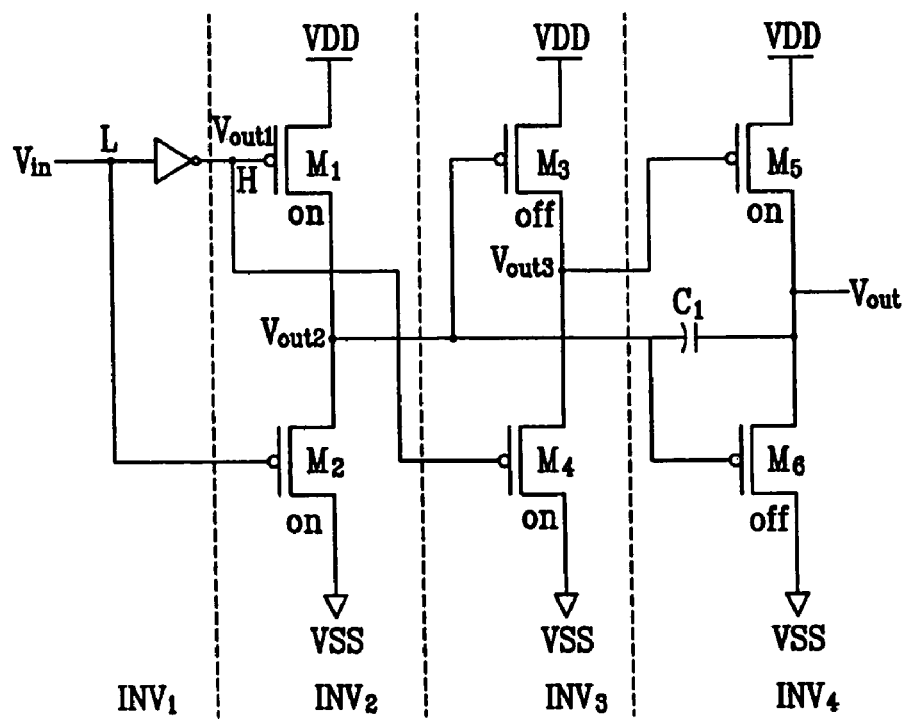
Figure 4C:
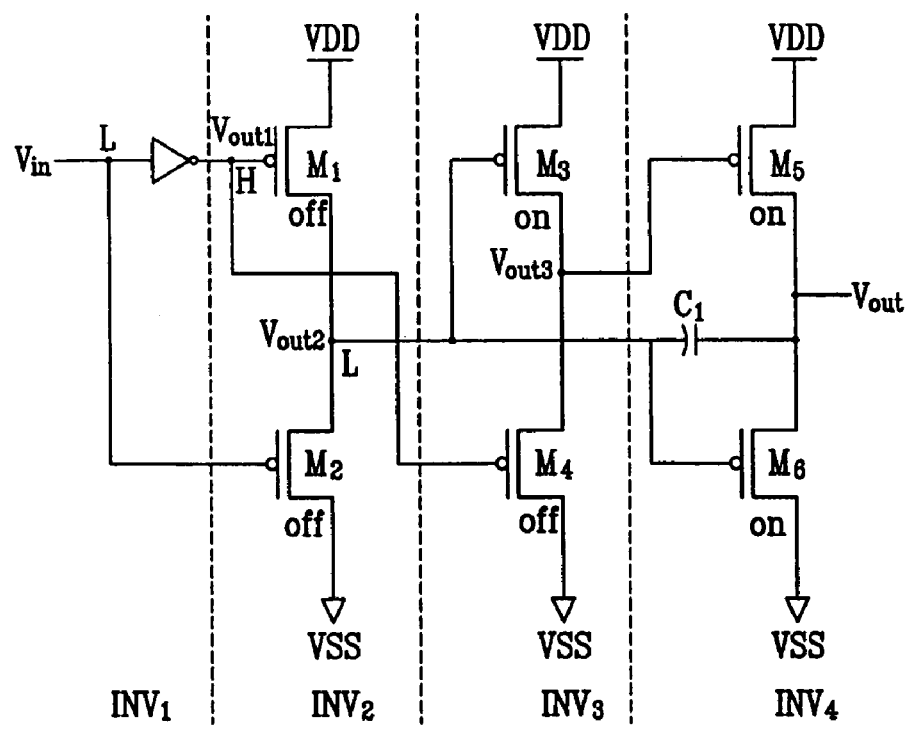
Figure 4D:
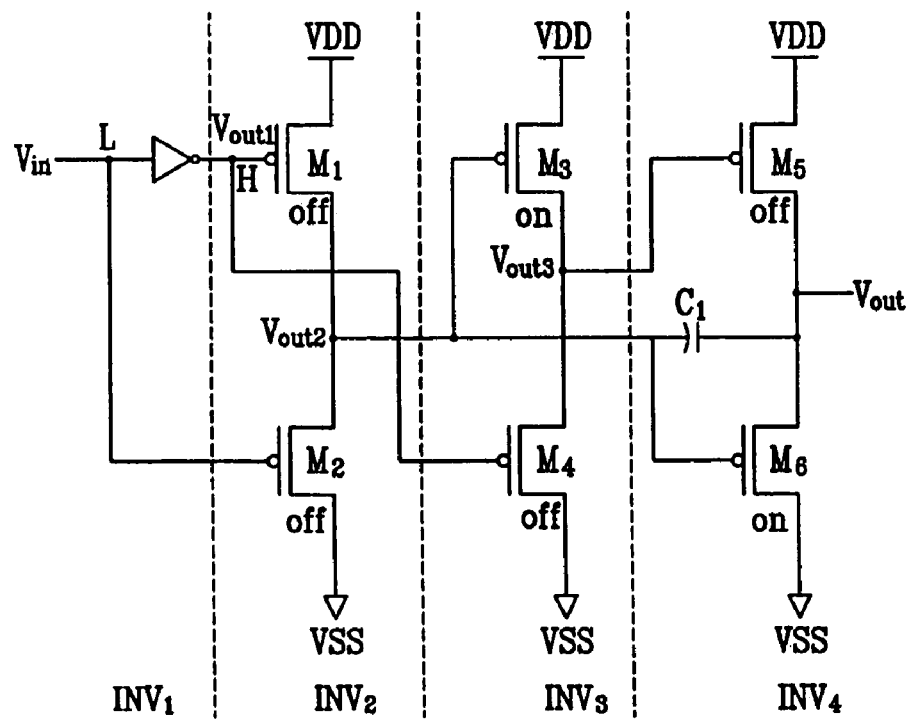

Referring to FIGS. 3 through 4D, a buffer circuit in one exemplary embodiment of the present invention will be described. FIG. 3 shows a circuit diagram of a buffer circuit according to an exemplary embodiment of the present invention, and FIGS. 4A through 4D show an operation of the buffer circuit according to the exemplary buffer circuit of FIG. 3.

As shown in FIG. 3, the buffer circuit includes four inverters INV1 through INV4. The inverters INV2 through INV4 respectively include PMOS transistors M1, M3, and M5 having a source coupled to a high power source for supplying a high-level voltage VDD, and PMOS transistors M2, M4, and M6 having a drain coupled to a low power source for supplying a low-level voltage VSS. Drains of the transistors M1, M3, and M5 are coupled, respectively, to sources of the transistors M2, M4, and M6. The coupling nodes between the transistors M1 and M2, M3 and M4, and M5 and M6, respectively, are outputs Vout2, Vout3, and Vout of the inverters INV2 through INV4. The output Vout of the inverter INV4 is an output of the buffer circuit, and a capacitor C1 is formed between a gate and a source of the transistor M6. The capacitor C1 is formed by one of parasitic capacitance of the transistor M6, an additional capacitor, and a combination of the parasitic capacitance and the additional capacitor.

The input voltage Vin of the buffer circuit is input to the inverter INV1 and a gate of the transistor M2, an output voltage Vout1 of the inverter INV1 is input to gates of the transistors M1 and M4, the output voltage Vout2 of the inverter INV2 is input to gates of the transistors M3 and M6, and the output voltage Vout3 of the inverter INV3 is input to a gate of the transistor M5. High-level and low-level potentials of the input voltage Vin of the buffer circuit are VDD and VSS, respectively.

Referring now to FIGS. 4A through 4D, an operation of the buffer circuit of FIG. 3 will be described.

As shown in FIG. 4A, when the input Vin becomes high-level, the transistor M2 is turned off and the output Vout1 of the inverter INV1 becomes low-level, thereby turning on the transistors M1 and M4. The drain voltage Vout2 of the transistor M1 becomes high level because of the voltage VDD, thereby turning off the transistors M3 and M6, and the source voltage Vout3 of the transistor M4 becomes low-level because of the voltage VSS, thereby turning on the transistor M5. Accordingly, the output Vout of the buffer circuit increases to VDD by turning on the transistor M5 and turning off the transistor M6.

As shown in FIG. 4B, when the input Vin becomes low-level, the transistor M2 is turned on, and the output Vout1 of the inverter INV1 becomes high-level. The transistor M5 still maintains the turned-on state caused by the previous high-level input Vin.

As shown in FIG. 4C, the transistors M1 and M4 are turned off because of the high-level output Vout1 of the inverter INV1. The gate voltage Vout2 at the transistors M3 and M6 is pulled down by the turned-on transistor M2 to the voltage of VSS+$|V_{TH2}|$ ($V_{TH2}$ is a threshold voltage at the transistor M2). When the gate voltage Vout2 at the transistors M3 and M6 becomes less than the voltage of VSS+$|V_{TH2}|$, the transistor M2 is turned off and the transistors M3 and M6 are turned on. In this instance, the voltage charged in the capacitor C1, that is, the source-gate voltage of the transistor M6 becomes greater than VDD-(VSS+$|V_{TH2}|$). Since the transistors M1 and M2 are turned off, the gate node of the transistor M6 is floated, and the voltage charged in the capacitor C1 is maintained.

As shown in FIG. 4D, the drain voltage of the transistor M3 becomes high level because of the turned-on transistor M3 and the turned-off transistor M4, thereby turning off the transistor M5. Therefore, the source voltage Vout of the transistor M6 becomes low-level because of the turned-on transistor M6. In this instance, since the source-gate voltage of the transistor M6 is maintained by the capacitor C1, the transistor M6 is bootstrapped to reduce the output voltage Vout of the buffer circuit to the low-level power supply voltage VSS.

In the exemplary embodiment of FIGS. 3 and 4A-4D, since no two transistors that form the inverters INV2, INV3, and INV4 are simultaneously turned on, no static current flows through the inverters INV2, INV3, and INV4, therefore power consumption caused by the static current is reduced or substantially removed. When a high-level voltage VDD is input to the buffer circuit, the output is also the high-level voltage VDD, and when a low-level voltage VSS is input to the buffer circuit, the output is also the low-level voltage VSS. That is, since the buffer circuit operates in the rail-to-rail way where both of input and output have the level of power supply voltages VDD and VSS, the driving voltage can be lowered to reduce power consumption.

Referring now to FIGS. 5 through 10, a method for reducing or substantially removing the static current flowing to the inverter INV1 by modifying the circuit configuration of the inverter INV1 in the buffer circuit of FIGS. 3 and 4A-4D will be described.

FIGS. 5 through 10 respectively show a circuit diagram of the buffer circuit according to first through sixth exemplary embodiments of the present invention.

Figure 5:
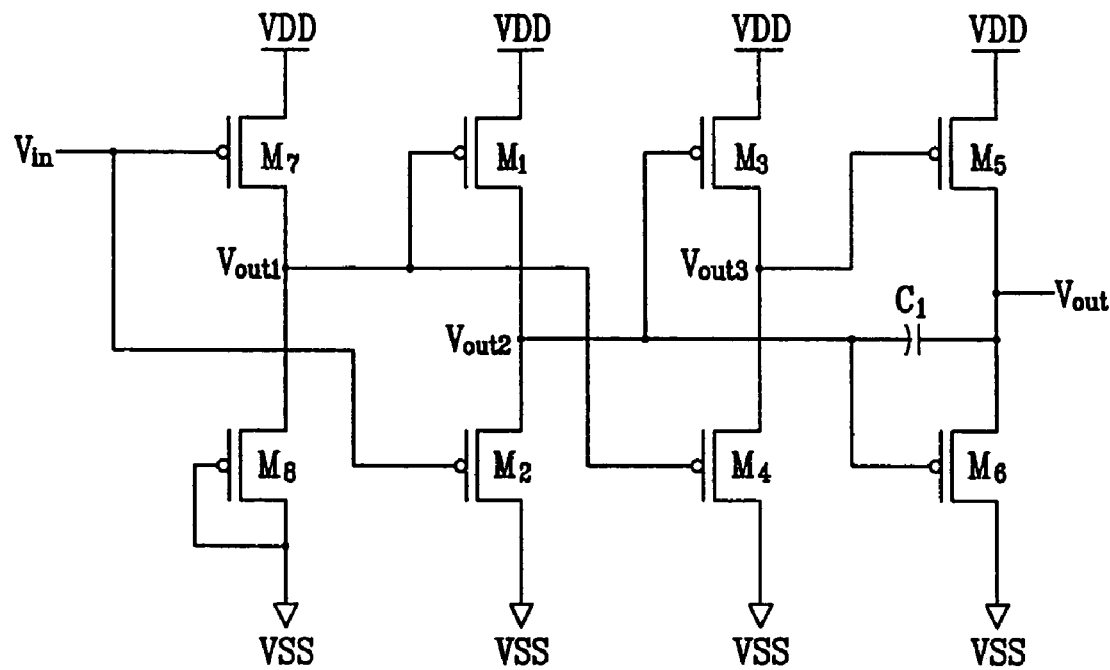
FIGS. 5 through 10 respectively show a circuit diagram of the buffer circuit according to first through sixth exemplary embodiments of the present invention.

As shown in FIG. 5, the inverter INV1 in the buffer circuit according to the first exemplary embodiment of the present invention includes PMOS transistors M7 and M8. In detail, a drain of the transistor M7 and a source of the transistor M8 are coupled together, and their coupling node is an output Vout1 of the inverter INV1. A source of the transistor M7 is coupled to a high power source for supplying a high-level voltage VDD, and a drain of the transistor M8 is coupled to a low power source for supplying a low-level voltage VSS. A drain and a gate of the transistor M8 are coupled together. In other words, the transistor M8 is diode-connected.

In the first exemplary embodiment, when the input voltage Vin is high-level, the transistor M7 is turned off to make the output voltage Vout1 of the inverter INV1 low-level. When the input voltage Vin is low-level, the transistor M7 is turned on to make the output voltage Vout1 of the inverter INV1 high-level, and a static current flows through the transistors M7 and M8. Since the static current flows only through the inverter INV1, the magnitude of the static current is small, and the static current accordingly does not severely influence the power consumption. In addition, since the input voltage Vin is high-level during most of the time of applying the buffer circuit to a scan driver of an active matrix display, the time when the static current exist is short.

Figure 6:
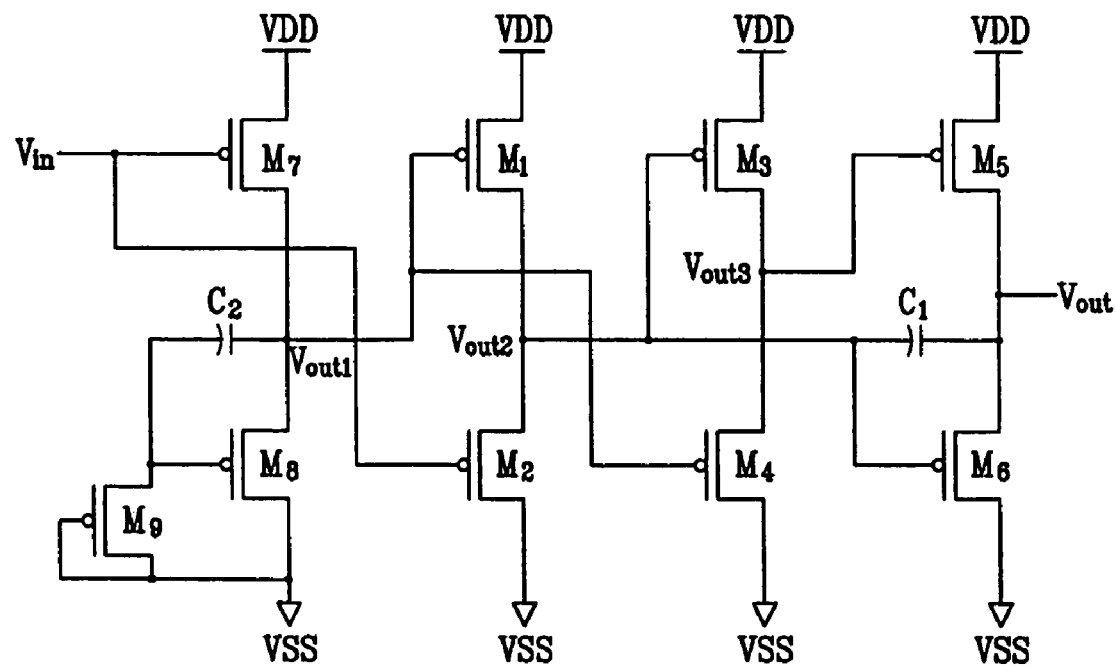

Referring to FIG. 6, the inverter INV1 of the buffer circuit according to the second exemplary embodiment includes three PMOS transistors M7, M8, and M9 and a capacitor C2. A drain of the transistor M7 and a source of the transistor M8 are coupled together, and their coupling node is an output Vout1 of the inverter INV1. A source of the transistor M7 is coupled to a high power source for supplying a high-level voltage VDD, and a drain of the transistor M8 is coupled to a low power source for supplying a low-level voltage VSS. A capacitor C2 is coupled between a gate and a source of the transistor M8. The capacitor C2 is formed by one of parasitic capacitance of the transistor M8, an additional capacitor, and a combination of the parasitic capacitance and the additional capacitor. The transistor M9, which is diode-connected, is coupled between the gate and drain of the transistor M8.

In the second exemplary embodiment, the gate voltage of the transistor M8 is controlled to be less than the voltage of VSS+|$V_{TH9}$| ($V_{TH9}$ is a threshold voltage of the transistor M9) because of the transistor M9. The reason for such control is that the transistor M9 is turned on to discharge the gate node of the transistor M8 when the gate voltage of the transistor M8 becomes greater than VSS+|$V_{TH9}$|. When the input voltage Vin of the buffer circuit is low-level, the transistor M7 is turned on to make the output voltage Vout1 of the inverter INV1 high-level. In this instance, the source-gate voltage of the transistor M8 charged in the capacitor C2 becomes greater than Vout1−(VSS+|$V_{TH9}$|). Since the static current that flows through the transistors M7 and M8 only flows to the inverter INV1, it has little influence on the power consumption.

When the input voltage Vin of the buffer circuit becomes high-level, the transistor M7 is turned off, thereby reducing the output voltage Vout1. In this instance, since the source-gate voltage of the transistor M8 is maintained by the capacitor C2, the transistor M8 is bootstrapped to reduce the output voltage Vout1 of the buffer circuit to the low-level power supply voltage VSS.

In the first and second exemplary embodiments, the bootstrapping of 1the transistor M6 is executed by charging the voltage in the capacitor C1 between the source and gate of the transistor M6 and floating the gate node of the transistor M6 according to the time difference of signal transmission. In this instance, the time difference may be short and a charging time may be insufficient, and accordingly, the magnitude of the voltage charged in the capacitor C1 may be small. Then, the magnitude of pull-down current of transistor M6 may be reduced, and the falling time of output voltage Vout may increase.

Figure 7:
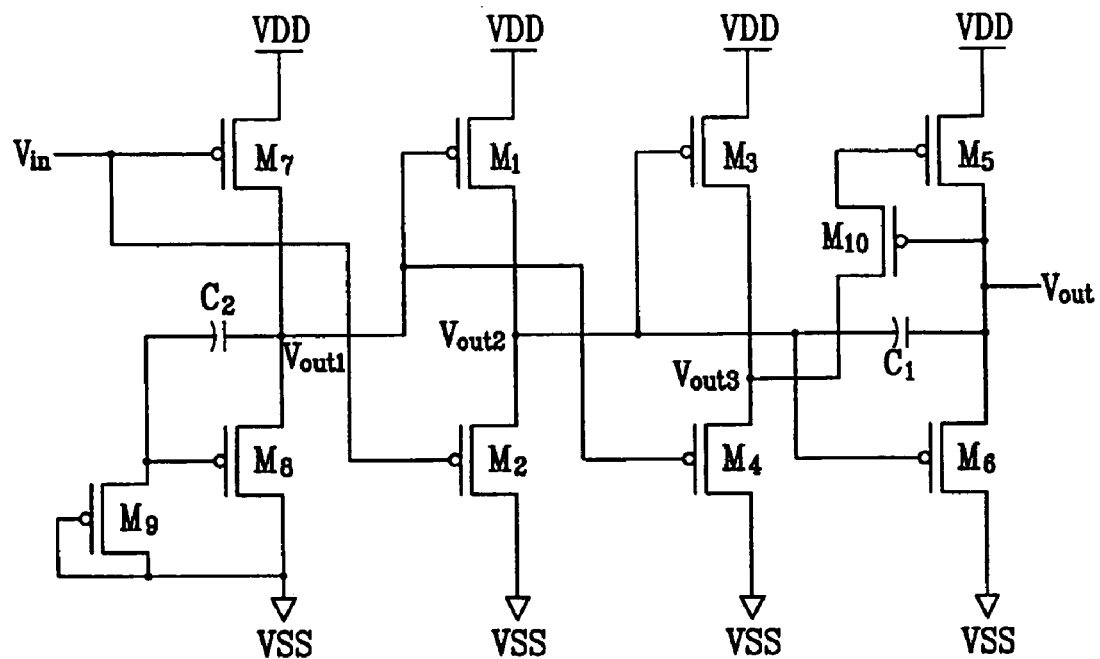
Figure 8:
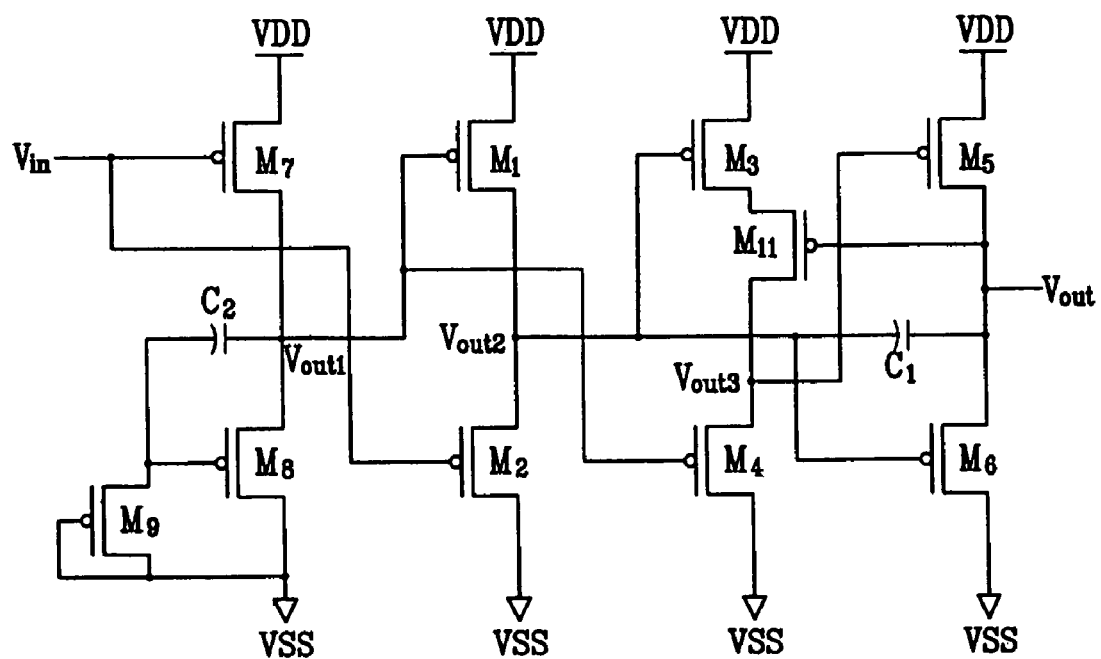
Figure 9:
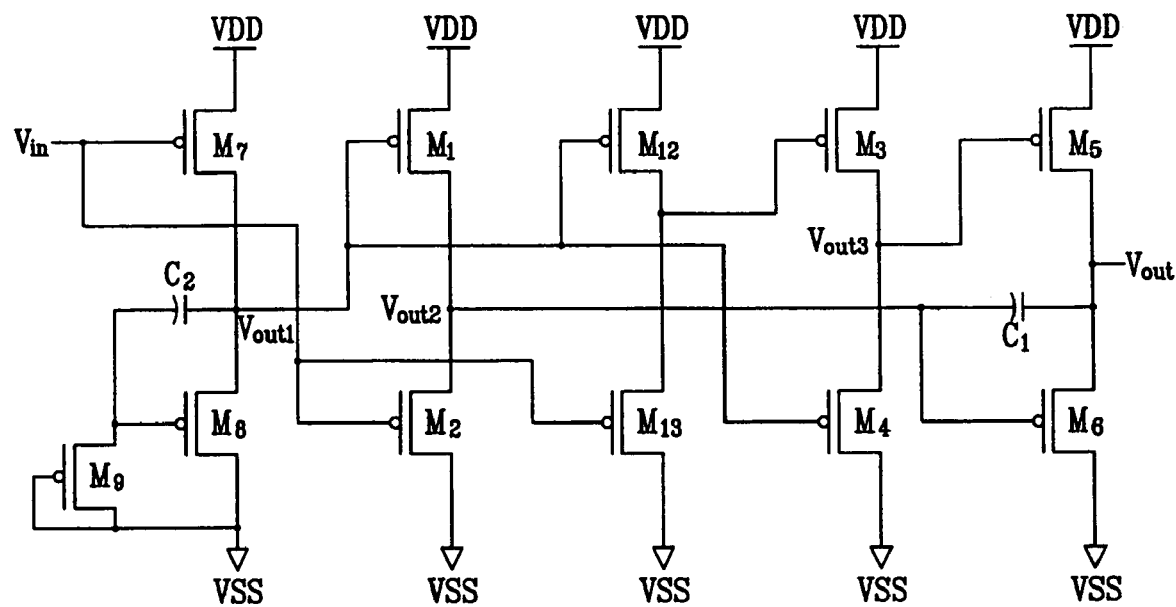

Referring now to FIGS. 7 through 9, exemplary embodiments, in which the transistor M5 is controlled to maintain the turned-on state until the transistor M2 is turned off so as to increase the charging time of the capacitor C1, will be described.

As shown in FIG. 7, the buffer circuit according to the third exemplary embodiment has the same configuration as that of the second exemplary embodiment except for an additional PMOS transistor M10.

In detail, the transistor M10 is coupled between a drain of the transistor M3 and a source of the transistor M5, and a gate of the transistor M10 is coupled to a drain of the transistor M5. In this instance, when the output voltage Is Vout3 of the inverter INV3 becomes a high-level voltage because of the turned-on transistor M3, the transistor M5 is not turned off because of the transistor M10, and when the output voltage Vout of the buffer circuit is less than VDD−|$V_{TH10}$| ($V_{TH10}$ is a threshold voltage of the transistor M10), the transistor M10 is turned on, and the transistor M5 is turned off. In this manner, the transistor M5 maintains the turned-on state until the transistor M2 is turned off. That is, since the turn-off time of the transistor M5 is delayed, the magnitude of the voltage charged in the capacitor C1 may increase. Therefore, the pull-down current of the transistor M6 may increase, thereby decreasing the falling time.

As shown in FIG. 8, the buffer circuit according to the fourth exemplary embodiment has the same configuration as that of the third exemplary embodiment except that a transistor M11 is used instead of the transistor M10.

In detail, the transistor M11 is coupled between a drain of the transistor M3 and a gate of the transistor M4, and a gate of the transistor M11 is coupled to a drain of the transistor M5. A node of the transistors M11 and M4 is an output Vout3 of the inverter INV3. Accordingly, when the output voltage Vout of the buffer circuit is less than VDD−|$V_{TH10}$| in the same manner as the third exemplary embodiment, the transistor M11 is turned on and the transistor M5 is turned off.

In the third and fourth exemplary embodiments, a single transistor is added to delay the time. In other exemplary embodiments, two transistors having the same coupling configuration as that of the transistors M1 and M2 may be added to delay the time, which will be described with reference to FIG. 9.

As shown in FIG. 9, the buffer circuit according to the fifth exemplary embodiment has the same configuration as that of the third exemplary embodiment except for the transistors M12 and M13 instead of transistor M10 or M11.

In detail, the transistors M12 and M13 are formed in the same manner as the transistors M1 and M2. That is, a source of the transistor M12 is coupled to a high power source for supplying a high-level voltage VDD, and a drain of the transistor M13 is coupled to a low power source for supplying a low-level voltage VSS. A drain of the transistor M12 and a source of the transistor M13 are coupled together, and their node is coupled to a gate of the transistor M3. The output Vout1 of the inverter INV1 is coupled to both gates of the transistors M1 and M12, and the input Vin of the buffer circuit is coupled to both gates of the transistors M2 and M13.

In the fifth exemplary embodiment, the transistors M1 and M2 drive the transistor M6, and the transistors M12 and M13 drive the transistor M3. In this instance, the time when the transistor M2 is turned off is determined by the time when the gate node of the transistor M6 is pulled down. Further, the time when the transistor M5 is turned off is determined by the time when the transistor M3 is turned on. The time when the transistor M3 is turned on is determined by the time when a low-level signal is output from the node of the transistors M12 and M13, and this time is determined according to characteristics of the transistors M12 and M13. Therefore, the transistor M5 can be maintained at the turned-on state until the transistor M2 is turned off, by modifying the characteristics of the transistors M12 and M13.

In the first through fifth exemplary embodiments, the buffer circuit receives a single input to operate. Differing from this, the buffer circuit can receive differential inputs to operate, which will now be described in reference to FIG. 10.

Figure 10:
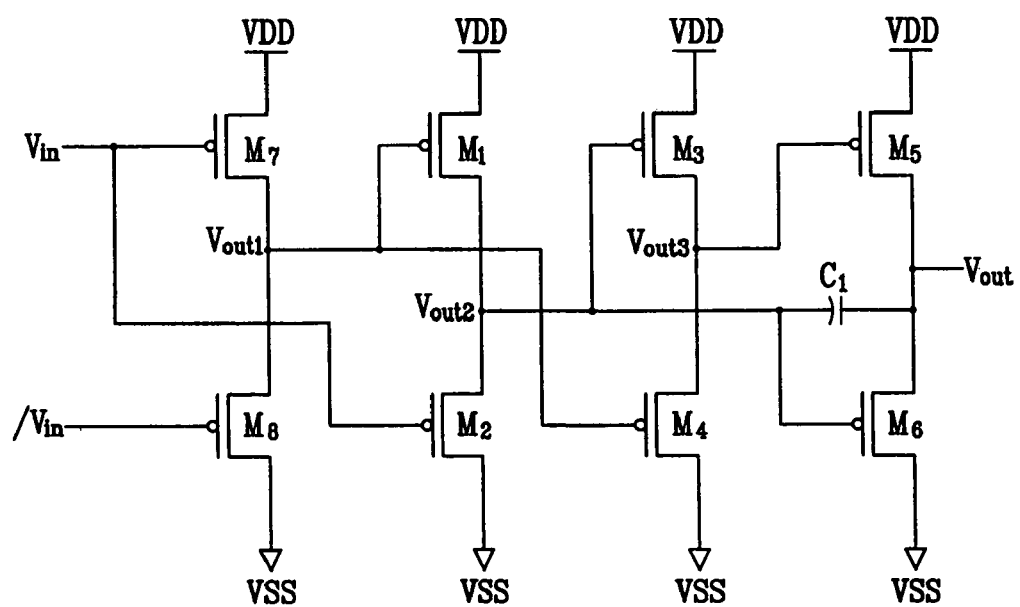

Referring now to FIG. 10, the inverter INV1 in the buffer circuit according to the sixth exemplary embodiment receives two signals Vin and /Vin in opposite phases. In the sixth exemplary embodiment, differential clock signals CLK and /CLK having opposite phases are used. In detail, the inverter INV1 includes a transistor M7 for receiving the clock signal CLK as the input Vin and a transistor M8 for receiving the clock signal /CLK as the input /Vin. A drain of the transistor M7 and a source of the transistor M8 are coupled together, and their node is an output Vout1 of the inverter INV1. A source of the transistor M7 is coupled to a high power source for supplying a high-level voltage VDD, and a drain of the transistor M8 is coupled to a power source for supplying a low-level voltage VSS. In this instance, the clock signal CLK corresponds to the input Vin of the inverter INV1 and is input to the gate of the transistor M2.

In the sixth exemplary embodiment, when the clock signal CLK is low-level, the transistor M7 is turned on, the transistor M8 is turned off, and the output of the inverter INV1 becomes high level. When the clock CLK is high level, the transistor M7 is turned off, the transistor M8 is turned on, and the output of the inverter INV1 becomes low level. In this instance, since the two transistors M7 and M8 are not concurrently turned on, substantially no static current flows through the inverter INV1.

The inverters INV2, INV3, and INV4 of the buffer circuit according to the sixth exemplary embodiment can be modified according to the third through fifth exemplary embodiments.

Next, referring to FIGS. 11 and 12, the case of applying the buffer circuit according to the sixth exemplary embodiment to the buffer of a scan driver of an active matrix display will be described. The buffer circuit according to the first through fifth exemplary embodiments can also be applied to the scan driver of the active matrix display.

Figure 11:
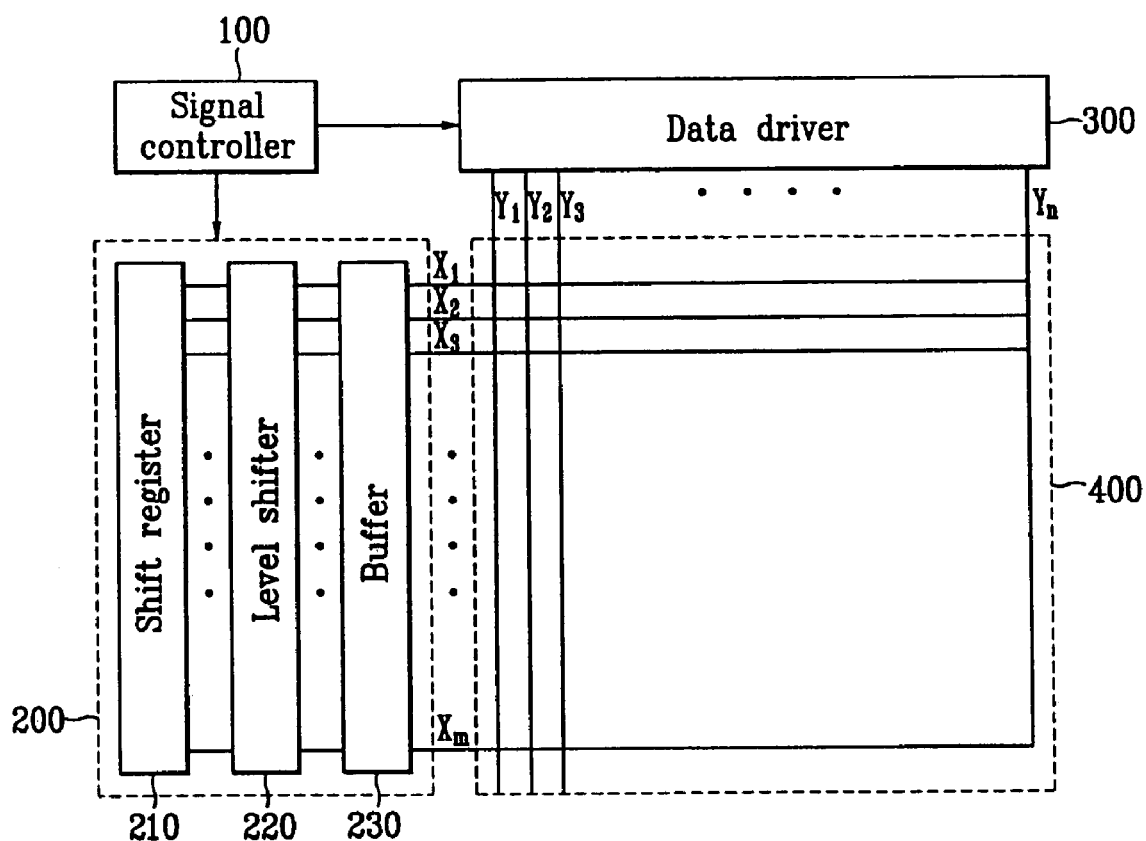
FIG. 11 shows a brief diagram of an active matrix display according to an exemplary embodiment of the present invention.
Figure 12:
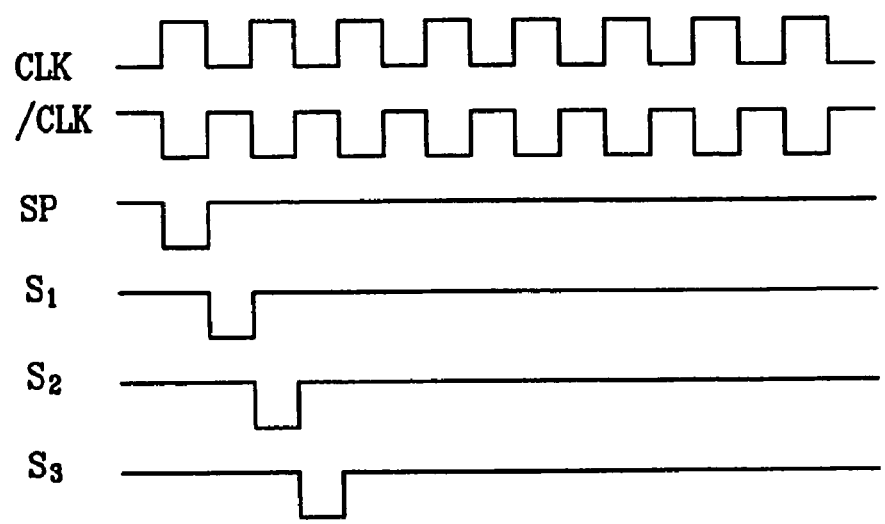
FIG. 12 shows a timing diagram of the buffer circuit according to seventh and eighth exemplary embodiments of the present invention.

FIG. 11 shows a brief diagram of an active matrix display according to an exemplary embodiment of the present invention, and FIG. 12 shows a timing diagram of the buffer circuit according to seventh and eighth exemplary embodiments of the present invention.

As shown in FIG. 11, the active matrix display includes a signal controller 100, a scan driver 200, a data driver 300, and a display panel 400. The signal controller 100 applies control signals to the scan driver 200 and the data driver 300. The data driver 300 applies data signals to data lines Y1 through Yn of the display panel 400 according to the control signals.

The scan driver 200 sequentially applies scan signals S1 through Sm to a plurality of scan lines X1 through Xm orderly formed in the row direction on the display panel 400. The scan driver 200 includes a shift register 210, a level shifter 220, and a buffer 230. The shift register 210 applies signals corresponding to the scan signals S1 through Sm of the respective scan lines X1 through Xm to the level shifter 220. The level shifter 220 converts voltage levels of the signals provided by the shift register 210 into voltage levels suitable for the buffer 230 and the display panel 400. Hence, the level shifter 220 may be removed if the voltage levels of the signals provided by the shift register 210 correspond to the voltage levels of the buffer 230 and/or the display panel 400. The buffer 230 compensates for an operation rate decrease caused by the load of the display panel 400.

The scan driver 200 and the data driver 300 are coupled to a glass substrate of the display panel 400. In other exemplary embodiments, the scan driver 200 and the data driver 300 may be directly installed on the glass substrate of the display panel 400, which is referred to as a COG (chip on glass) method. Also, the scan driver 200 and/or data driver 300 can be substituted with a driving circuit formed in the same layer as that of the scan lines X1 through Xm, the data lines Y1 through Yn, and the transistors on the glass substrate of the display panel 400.

Referring to FIG. 12, a buffer used by the scan driver 200 of the active matrix display shown in FIG. 11 will now be described in detail. The buffer 230 may include a plurality of buffer circuits, each corresponding to one of the scan lines X1 through Xn.

In the buffer circuit shown in FIG. 10 according to the seventh exemplary embodiment, the scan signals S1 through Sm are provided to the input Vin, and the clock signals CLK or inverted clock signals /CLK are provided to the input /Vin. In detail, the inverted clock signals /CLK are provided to the input /Vin in the buffer circuit for receiving the scan signals S1, S3, ..., $S_{odd}$ corresponding to the scan lines X1, X3, ..., $X_{odd}$ at the input Vin, and the clock signals CLK are provided to the input /Vin in the buffer circuit for receiving the scan signals S2, S4, ..., $S_{even}$ corresponding to the scan lines X2, X4, ..., $X_{even}$ at the input Vin.

As shown in FIG. 12, since the clock signal /CLK is high level when the scan signals S1, S3, ..., $S_{odd}$ are low level, and the clock signal CLK is high level when the scan signals S2, S4, ..., $S_{even}$ are low level, the buffer circuit according to the seventh exemplary embodiment operates in the same manner as the buffer circuit of FIG. 10. Also, the output values are maintained when the inputs Vin and /Vin are high-level. That is, since the input /Vin is high level when the scan signals S1 through Sm that are the input Vin of the buffer circuit, the buffer circuit outputs low-level scan signals S1 through Sm.

Next, in the buffer circuit according to the eighth exemplary embodiment, the present scan signals S1 through Sm are provided to the input Vin, and the next scan signals S2 through Sm are provided to the input /Vin. For example, the scan signal S2 is provided to the input /Vin of the buffer circuit with the scan signal S1 provided to the input Vin. As shown in FIG. 12, since the scan signal S2 is high level when the scan signal S1 is low level, the buffer circuit according to the eighth exemplary embodiment outputs the low level scan signal S1 in the same manner as the buffer circuit described in FIG. 10. Identically, the scan signal S3 is provided to the input /Vin of the buffer circuit with the scan signal S2 provided to the input Vin, and since the scan signal S3 is high level when the scan signal S2 is low level, the buffer circuit outputs the low-level scan signal S2.

Since the scan signal S3 gets low level when the scan signal S2 gets high level, the buffer circuit outputs the high-level scan signal in the same manner as the buffer circuit of FIG. 10. Also, when the scan signals S2 and S3 are high-level, the buffer circuit maintains its output.

In the exemplary embodiments of the present invention, PMOS transistors are used to configure a buffer circuit. In alternate embodiments, NMOS transistors and/or any other suitable transistors may also be applied to the buffer circuit. Those skilled in the art would know how to modify the exemplary embodiments described herein to practice the present invention using PMOS or other suitable transistors. Therefore, no description will be provided herein for such alternate embodiments.

According to the exemplary embodiments of the present invention, the driving voltage can be lowered to reduce the power consumption since the buffer circuit operates in rail-to-rail way. Also, power consumption caused by the static current can be drastically reduced or removed since little or no static current flows through the inverters forming the buffer circuit.

While this invention has been described in connection with certain exemplary embodiments, it is to be understood that the invention is not limited to the disclosed exemplary embodiments, but, on the contrary, is intended to cover various modifications included within the spirit and scope of the appended claims and equivalents thereof.

What is claimed is:

1. A buffer circuit comprising:
 a first transistor coupled between a first power source for supplying a first voltage of a first level and a first node, the first transistor having a gate for receiving a first signal having a first signal level;
 a second transistor coupled between the first node and a second power source for supplying a second voltage of a second level, the second transistor having a gate for receiving a second signal having a second signal level, which is an inverse of the first signal level;

a third transistor having a gate coupled to the first node, the third transistor being coupled between the first power source and a second node;

a fourth transistor coupled between the second node and the second power source, the fourth transistor having a gate for receiving the first signal;

a fifth transistor having a gate coupled to the second node, the fifth transistor being coupled between the first power source and an output end; and a sixth transistor having a gate coupled to the first node, the sixth transistor being coupled between the output end and the second power source, wherein capacitance is formed between the gate of the sixth transistor and the output end.

2. The buffer circuit of claim 1, further comprising an inverter for receiving the second signal and outputting the first signal, a third node for outputting the first signal being coupled to the gate of the first transistor.

3. The buffer circuit of claim 2, wherein the inverter comprises:

a seventh transistor coupled between the first power source and the third node, the seventh transistor having a gate for receiving the second signal; and an eighth transistor being diode-connected, and being coupled between the third node and the second power source.

4. The buffer circuit of claim 2, wherein the inverter comprises:

a seventh transistor coupled between the first power source and the third node, the seventh transistor having a gate for receiving the second signal;

an eighth transistor coupled between the third node and the second power source, wherein another capacitance is formed between a gate of the eighth transistor and the third node; and a ninth transistor being diode-connected, and being coupled between the gate of the eighth transistor and the second power source.

5. The buffer circuit of claim 1, further comprising a seventh transistor having a gate coupled to the output end, the seventh transistor being coupled between the gate of the fifth transistor and the second node.

6. The buffer circuit of claim 1, further comprising a seventh transistor having a gate coupled to the output end, the seventh transistor being coupled between the third and fourth transistors.

7. The buffer circuit of claim 1, further comprising:

a seventh transistor coupled between the first power source and the gate of the third transistor, the seventh transistor having a gate for receiving the first signal; and an eighth transistor coupled between the gate of the third transistor and the second power source, the eighth transistor having a gate for receiving the second signal.

8. The buffer circuit of claim 1, further comprising:

a seventh transistor having a gate for receiving the second signal, the seventh transistor being coupled between the first power source and the gate of the first transistor; and an eighth transistor having a gate for receiving the first signal, the eighth transistor being coupled between the gate of the first transistor and the second power source.

9. The buffer circuit of claim 1, wherein at least a part of the capacitance is formed by parasitic capacitance of the sixth transistor.

10. The buffer circuit of claim 1, wherein at least a part of the capacitance is formed by a capacitor coupled between the gate of the sixth transistor and the output end.

11. The buffer circuit of claim 1, wherein the first through sixth transistors are PMOS transistors, the first level is a high level, and the second level is a low level.

12. The buffer circuit of claim 1, wherein the first through sixth transistors are NMOS transistors, the first level is a low level, and the second level is a high level.

13. A buffer circuit comprising:

a first transistor coupled between a first power source for supplying a first voltage of a first level and an output end;

a second transistor coupled between a second power source for supplying a second voltage of a second level and the output end, wherein capacitance is formed between the gate of the second transistor and the output end; and a driving circuit for the first and second transistors, comprising a third transistor coupled between the gate of the second transistor and the second power source, the third transistor having a gate for receiving a first signal having a first signal level, wherein the driving circuit turns on the first transistor and turns off the second transistor when the first signal level is substantially the first level, and wherein the driving circuit turns on the third transistor to charge the capacitance with voltage, floats the gate node of the second transistor so that the second transistor can bootstrap, and turns off the first transistor, when the first signal level is substantially the second level.

14. The buffer circuit of claim 13, wherein the driving circuit further comprises:

a fourth transistor coupled between the first power source and the gate of the first transistor, the fourth transistor being turned on when the first signal level is substantially the second level; and a fifth transistor coupled between the gate of the first transistor and the second power source, the fifth transistor being turned on when the first signal level is substantially the first level.

15. The buffer circuit of claim 14, wherein the driving circuit further comprises a sixth transistor having three terminals that are coupled, respectively, to the fourth transistor, the gate of the first transistor, and the output end.

16. The buffer circuit of claim 14, further comprising an inverter for receiving the first signal and outputting a second signal having a second signal level, which is an inverse of the first signal level, wherein a first node for outputting the second signal is coupled to the gate of the fifth transistor.

17. The buffer circuit of claim 14, comprising:

a sixth transistor coupled between the first power source and the gate of the fifth transistor, the sixth transistor having a gate for receiving the first signal; and a seventh transistor coupled between the gate of the fifth transistor and the second power source, the seventh transistor having a gate for receiving a second signal having a second signal level, which is an inverse of the first signal level.

* * * * *